US009780805B2

United States Patent
Finlay (10) Patent No.: US 9,780,805 B2
(45) Date of Patent: *Oct. 3, 2017

(54) PREDICATE APPLICATION THROUGH PARTIAL COMPRESSION DICTIONARY MATCH

(71) Applicant: International Business Machines Corporation, Armonk, NY (US)

(72) Inventor: Ian R. Finlay, Uxbridge (CA)

(73) Assignee: International Business Machines Corporation, Armonk, NY (US)

( * ) Notice: Subject to any disclaimer, the term of this patent is extended or adjusted under 35 U.S.C. 154(b) by 386 days.

This patent is subject to a terminal disclaimer.

(21) Appl. No.: 14/520,485

(22) Filed: Oct. 22, 2014

(65) Prior Publication Data

US 2016/0117343 A1   Apr. 28, 2016

(51) Int. Cl.
  *H03M 7/40*   (2006.01)
  *H03M 7/30*   (2006.01)

(52) U.S. Cl.
  CPC ....... *H03M 7/4087* (2013.01); *H03M 7/3088* (2013.01); *H03M 7/6005* (2013.01); *H03M 7/6017* (2013.01)

(58) Field of Classification Search
  CPC ........ G06F 17/30309; G06F 17/30153; G06F 17/30315; G06F 17/3033; G06F 17/30106; G06F 17/30321; G06F 17/30616; G06F 17/301; G06F 17/30339; G06F 17/2276; G06F 17/2735; G06F 17/30336; H03M 7/6005; H03M 7/6017; H03M 7/30; H03M 7/3088; H03M 7/3084; H03M 7/4087

USPC ........ 707/999.003, E17.014, 693, 802, 741, 707/715, 706, E17.084; 341/106

See application file for complete search history.

(56) References Cited

U.S. PATENT DOCUMENTS

| 5,442,350 A * | 8/1995 | Iyer ................... G06F 17/30595 341/106 |
| 6,170,047 B1 | 1/2001 | Dye |
| 6,370,631 B1 | 4/2002 | Dye |
| 6,614,368 B1 * | 9/2003 | Cooper ............... H03M 7/3084 341/106 |

(Continued)

OTHER PUBLICATIONS

Fusco et al; "RasterZip: Compressing Network Monitoring Data with Support for Partial Decompression;" IMC '12 Proceedings of the 2012 ACM conference on Internet measurement conference; Nov. 14-16, 2012; ACM Copyright 2012. pp. 1-14.

(Continued)

*Primary Examiner* — Robert Beausoliel, Jr.
*Assistant Examiner* — Pedro J Santos
(74) *Attorney, Agent, or Firm* — Molborn Patents, Inc.; Fredrik Mollborn (57) ABSTRACT

Methods and apparatus, including computer program products, implementing and using techniques for predicate application using partial compression dictionary match. A search strategy is developed for each predicate to be applied to compressed data. The compressed data is searched using the search strategy to locate the compression symbols identified in the search strategy. In response to locating a compression symbol from the search strategy in the compressed data, a respective row and applying the predicate is decompressed and a respective row that matches the predicate is returned to a database engine or an application.

10 Claims, 5 Drawing Sheets

(56) References Cited

U.S. PATENT DOCUMENTS

| | | | |
|---|---|---|---|
| 7,051,152 | B1 | 5/2006 | Danilak |
| 7,526,607 | B1 | 4/2009 | Singh et al. |
| 2002/0109615 | A1* | 8/2002 | Abdat .................. H03M 7/3088 341/51 |
| 2005/0210023 | A1* | 9/2005 | Barrera ............. G06F 17/30463 |
| 2006/0098031 | A1 | 5/2006 | Lai et al. |
| 2010/0121826 | A1* | 5/2010 | Mitsuhashi ............. H04L 67/28 707/693 |
| 2010/0161650 | A1 | 6/2010 | Chaitanya et al. |
| 2010/0281004 | A1 | 11/2010 | Kapoor et al. |
| 2010/0328115 | A1* | 12/2010 | Binnig ............. G06F 17/30454 341/51 |
| 2011/0270862 | A1* | 11/2011 | Tamiya ............. G06F 17/30911 707/759 |
| 2011/0307521 | A1 | 12/2011 | Slezak et al. |
| 2011/0320446 | A1 | 12/2011 | Chakrabarti et al. |
| 2012/0054225 | A1 | 3/2012 | Marwah et al. |
| 2012/0130965 | A1* | 5/2012 | Oh ..................... H03M 7/3088 707/693 |
| 2012/0209873 | A1* | 8/2012 | He .................... G06F 17/30489 707/769 |
| 2012/0246153 | A1* | 9/2012 | Pehle ................ G06F 17/30864 707/723 |
| 2012/0323929 | A1 | 12/2012 | Kimura et al. |
| 2012/0330908 | A1* | 12/2012 | Stowe ............... G06F 17/30955 707/693 |
| 2013/0103655 | A1 | 4/2013 | Fanghaenel et al. |
| 2013/0238865 | A1 | 9/2013 | Kataoka et al. |
| 2015/0317327 | A1* | 11/2015 | He .................... G06F 17/30327 707/693 |

OTHER PUBLICATIONS

Updated List of IBM Patents or Patent Applications Treated as Related.
USPTO Office Action; U.S. Appl. No. 14/032,122; Notification Date: Feb. 18, 2016.
USPTO Office Action; U.S. Appl. No. 14/307,838; Notification Date: Feb. 18, 2016.
List of IBM Patents or Patent Applications Treated as Related.
Tripney, Brian G. et al. "Data value storage for compressed semi-structured data." H. Decker (Eds.): DEXA Part II, LNCS 8056, Springer-Verlag Berlin Heidelberg 2013. pp. 174-188.
Abadi, Daniel J. et al. "Integrating compression and execution in column-oriented database systems." SIGMOD 2006, Jun. 27-29,2006, Chicago, Illinois, USA. 12 pp.
Nabina, A. et al.; "Dynamic Reconfiguration Optimization with Streaming Data Decompression"; 2010 International Conference on Field Programmable Logic and Applications; IEEE.; 2010.
Amihood, A. et al.; "Let Sleeping Files Lie: Pattern Matching in Z-Compressed Files"; Journal of Computer and System Sciences 52, 299-307, Article 0023; 1996.
Tao, Tao; "Pattern Matching in LZW Compressed Files"; IEEE Transactions on Computers, vol. 54, No. 8; Aug. 2005.
Chen et al. "Query Optimization in Compressed database systems", Newsletter; ACM SIGMOD Record Homepage; vol. 30 Issue 2, Jun. 2001 ; pp. 271-282; ACM New York, NY, USA.

* cited by examiner

PREDICATE APPLICATION THROUGH PARTIAL COMPRESSION DICTIONARY MATCH

BACKGROUND

The present invention relates to database systems, and more specifically, to compression and decompression techniques for use in database systems. Database systems manage large amounts of data, and commonly use data compression as a means to reduce the amount of disk and/or memory storage used to house data objects.

For example, the DB2® database system, which is available from International Business Machines Corporation of Armonk, N.Y., offers a storage optimization feature, which uses a combination of compression techniques to compress data on disk to decrease disk space and storage infrastructure requirements. Since disk storage systems can often be some of the most expensive components of a database solution, even a small reduction in the storage subsystem can result in substantial cost savings for the overall database solution.

One example of a commonly used compression technique is dictionary-based compression. Compression systems such as LZW, and other Huffman-coding based techniques are often applied at the row level, and sometimes also at the page level. When a row needs to be examined to see whether it qualifies a predicate, the row needs to be decompressed, the column(s) need to be located within the row, and finally the predicate(s) are applied to the decompressed data. The decompression typically expands rows or pages to several times their compressed size, and typically also involves a plethora of dictionary lookups and copying the dictionary entries into a buffer when reconstructing a page or a row. This not only consumes CPU resources, but also requires significant memory and/or cache. Therefore, it would be advantageous to have techniques that reduce the amount of CPU resources that are needed when only a portion of the compressed data needs to be accessed.

SUMMARY

According to one aspect of the present invention, techniques are provided for predicate application using partial compression dictionary match. A search strategy is developed for each predicate to be applied to compressed data. The search strategy includes:
  searching entries of a compression dictionary for an entire predicate value to identify each matching symbol and noting an exact match, and a subsumed match of a compression symbol in a search list;
  searching the entries of the compression dictionary to identify entries in which a predicate prefix forms a dictionary entry suffix and noting each matching compression symbol in the search list;
  searching the entries of the compression dictionary to identify entries in which a predicate suffix forms a dictionary entry prefix and noting each matching compression symbol in the search list;
  searching the entries of the compression dictionary to identify entries which form a mid-predicate match and noting each matching compression symbol in the search list; and
  adding one or more uncompressed symbol for predicates having no match in the compression dictionary, and for predicates having only one or more subsumed dictionary matches;

The compressed data is searched to locate the compression symbols identified in the search list. In response to locating a compression symbol from the search list in the compressed data, a respective row is decompressed and the predicate is applied. A respective row that matches the predicate is returned to a database engine or an application.

The details of one or more embodiments of the invention are set forth in the accompanying drawings and the description below. Other features and advantages of the invention will be apparent from the description and drawings, and from the claims.

BRIEF DESCRIPTION OF THE SEVERAL VIEWS OF THE DRAWINGS

Like reference symbols in the various drawings indicate like elements.

DETAILED DESCRIPTION

Overview

The various embodiments of the invention described herein pertain to techniques for pre-qualifying dictionary tokens and identifying those tokens that contain full or partial predicate matches. Copending U.S. patent application Ser. No. 14/032,122, titled "Improved Data Access Performance Using Decompression Maps", filed on Sep. 19, 2013, which has a common assignee with the present application, is incorporated herein by reference. That application describes techniques for identifying a byte range for a column of interest for decompression. When combined with the techniques described herein, it is possible to decompress only ranges that contain tokens that have been pre-qualified as containing parts of the predicate. As will further be described below, it is also possible to construct a pattern match for the compression token(s) and only search for the set(s) of tokens that will apply the predicate, when they occur within the correct range of a row's bytes. These techniques significantly reduce CPU and memory/cache bandwidth use, and can be implemented by those of ordinary skill in the art in essentially any system that employs dictionary compression and needs to perform searches of that compressed data.

To achieve this requires the ability to perform partial predicate matches to the decompression strings. There may be more than one decompression string that may partially match a predicate. For example, the "tail" (or trailing characters) of the decompression string may match the start of the predicate value, with other decompression strings completing the pattern; the "head" (or first characters) of the decompression string may match the end of the predicate value, with other decompression strings completing the pattern; or the predicate value may be fully contained within the decompression string. This matching is repeated for each predicate that needs to be applied, and any adjoining column(s) symbols are combined. The set of qualified compression symbols then forms a series of search patterns for the compressed data. When combined with the techniques described in the related application, and the predicate value's offset into the decompression string, exact predicate application can be made without any decompression.

In accordance with one embodiment, there are two key methods involved in the technique: a partial dictionary match of predicate value(s), and an exact dictionary match of the predicate value(s). Each of these methods will now be described in further detail.

Partial Dictionary Match

In the partial dictionary match method, the dictionary is searched to determine whether any dictionary entries partially match the predicate value. One or more compression symbols are then used in the search of the compressed data as described below. As an example, consider the following dictionary table t1 and the query:

select * from t1 where c1='fghxyz'

| Dictionary Table t1 | |
|---|---|
| Symbol | Dictionary Entry |
| 01 | abcdefgh |
| 02 | ijklmnopq |
| 03 | rstuvwxyz |

When searching the dictionary entries, there is a partial match, "fgh", at the end of symbol 01, and a partial match, "xyz" at the end of symbol 03. Since "fgh" forms the beginning of the predicate, a potential match could be found when symbol 01 is found. However, with symbol 03, because the dictionary entry has "xyz" at the end of the symbol's entry, this cannot be a potential match. Therefore, in this case, it makes sense to search for either the symbol 01, or to search for non-compressed symbol sequences for "f", "g", "h", "x", "y", and "z", respectively.

Similarly, if the sequence of symbol 01 is found, followed by the uncompressed sequence "xyz", then there is a potential match for the actual predicate. With knowledge of the column positions, this could be used to exactly match the predicate to the compressed data, without ever having to actually decompress the data.

As another example, consider yet again the same dictionary table t1 and the query:

select * from t1 where c1='hijklmnopqrst'

When searching the dictionary entries, not only is the suffix of symbol 01 found, 'h', and the prefix of symbol 03 found, 'rst', but there is a partial match of the string for symbol 02, 'ijklmnopqr' found within the predicate. Since this forms a middle portion of the predicate, a potential match could be found when symbol 02 is found also. From this one can form the search list of exact matches as: symbol 01, symbol 02, symbol 03, or symbol 01, symbol 02, and the uncompressed sequence 'rst', or the uncompressed sequence 'h', symbol 02, symbol 03, or the uncompressed sequence 'h', symbol 02 and the uncompressed sequence 'rst'.

Full Dictionary Match

As an example of a full dictionary match method, consider the same dictionary table t1 as above, and the query:

select * from t1 where c1='abcdefgh'

When searching the dictionary entries, there is an exact match for the predicate in the entry for symbol 01. If the symbol 01 is found in the compressed data and if that symbol is at the column boundary/position for column c1, then a qualifying row for the above query has been found. It is further possible to determine from examination of the compression dictionary, that the only place where "abcdefgh" will exist is when symbol 01 is located. Since there is no overlap with any other dictionary entry, there is no need to also search for components of uncompressed data (assuming the data is fully and properly compressed).

As another example, consider yet again the same dictionary table t1 and the query:

select * from t1 where c1='cde'

When searching the dictionary entries, an exact match is found for the predicate in the entry for symbol 01. As with the above example, it is known that if symbol 01 is found in the compressed data, and it is in the correct position/offset in the row, that a match for the predicate has been found. However, in contrast to the above example, this is not the only form of the predicate that needs to be searched for in the compressed data. It is possible for the sequence to exist with other combinations of values before or after 'cde', so it is also necessary to search for the uncompressed sequence 'cde'.

Various embodiments of a matching algorithm in accordance with the invention will now be described with reference to FIGS. 1-5. Matching algorithms for a single predicate search, for an ANDed predicate search, and for an ORed predicate search will now be described.

Matching Algorithm—Single Predicate Search

Figure 1:
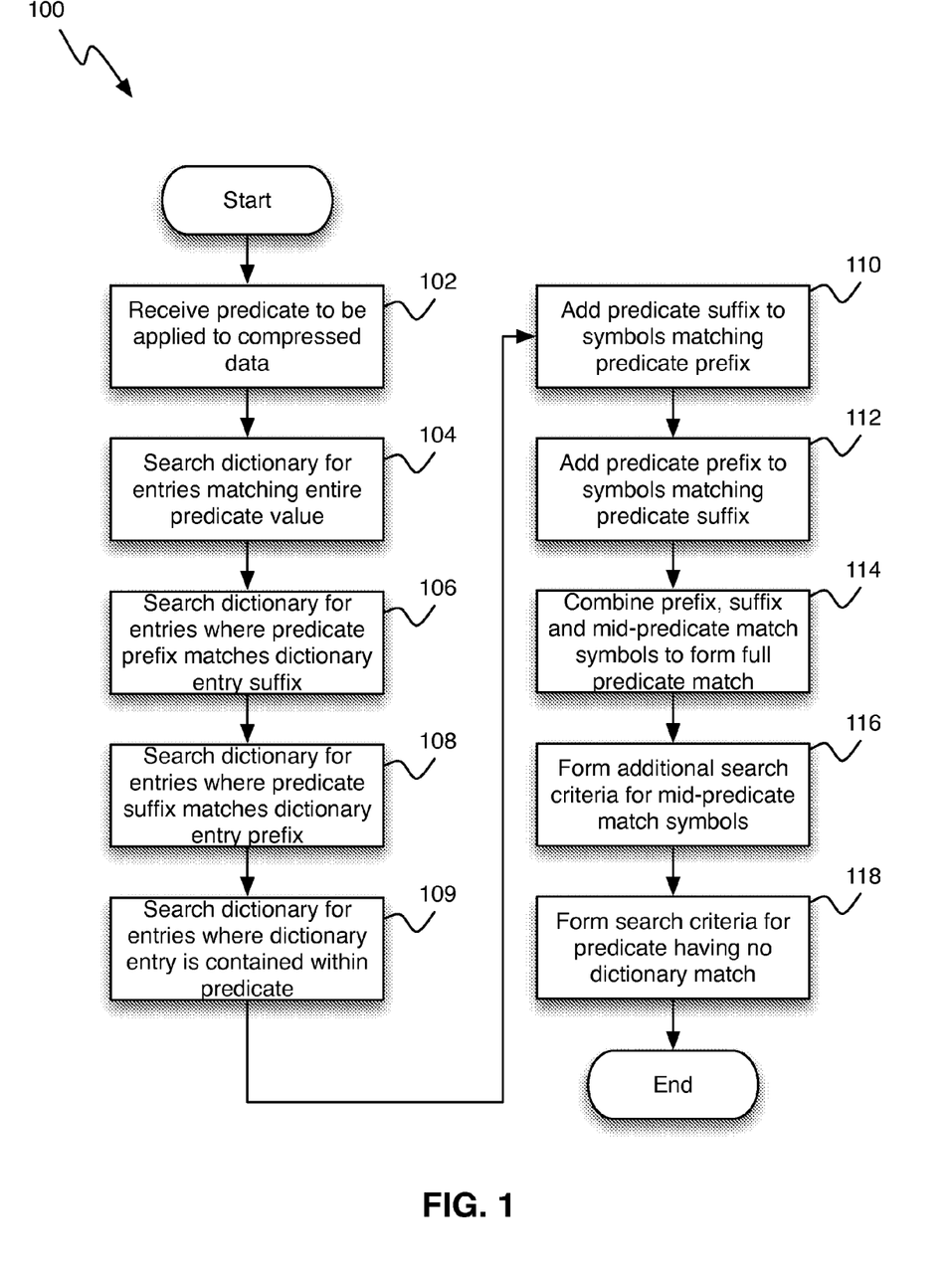
FIG. 1 shows a process (100) in accordance with one invention for forming the search criteria.

FIG. 1 shows a process (100) in accordance with one invention for forming the search criteria. As can be seen in FIG. 1, the process (100) starts by receiving a predicate to be applied to the compressed data (step 102). Next, the dictionary entries are searched to find matches for the entire predicate value (step 104). Each matching symbol is noted, and if there is an exact match (i.e., both length and value) a note of this is also made.

Next, the dictionary entries are searched to find entries in which the lead bytes of the predicate (also referred to as the prefix) form the trailing bytes (also referred to as the suffix) of a dictionary entry (step 106). Each matching symbol is noted.

Next, the dictionary entries are searched to find entries in which the trailing bytes of the predicate (i.e., the suffix) match the leading bytes (i.e., the prefix) of a dictionary entry (step 108). Each matching symbol is noted.

Next, the dictionary entries are searched to find entries in which the dictionary entry is contained within the predicate, forming a mid-predicate match (step 109). Each matching symbol is noted.

Next, the predicate suffix is added to the search for that dictionary symbol, in order to form a full predicate match (step 110). The suffix can be in the form of uncompressed symbols, compressed mid-predicate match symbols (step 109), or a combination of compressed and uncompressed symbols that represent the predicate. It should be noted that in some embodiments, adding the predicate suffix is an optional step. In some embodiments the prefix match can instead be used to trigger decompression of the row, and match or apply the predicate to the decompressed row.

For each predicate suffix that matches a dictionary prefix, the predicate prefix is added to the search for that dictionary symbol, in order to form a full predicate match (step 112). The prefix can be in the form of uncompressed symbols, compressed mid-predicate match symbols, or a combination of compressed and uncompressed symbols that represent the predicate. It should be noted that in some embodiments, adding the predicate prefix is an optional step. Instead, the embodiment can use the suffix match to trigger decompression of the row, and match or apply the predicate to the decompressed row.

For sets of dictionary symbols which form the prefix and suffix of the predicate, and do not overlap, another search criteria is formed by combining the prefix symbol from step 106, the suffix symbol from step 108 and the compressed mid-predicate match symbols from step 109, or uncompressed symbols between the prefix and suffix (if any), in order to form a full predicate match (step 114).

For the mid-predicate match symbols identified in step 109, additional search criteria are formed by generating the unique combinations of pre-pending the this missing compressed and uncompressed symbols to complete the start of the predicate, and appending the missing compressed and uncompressed symbols required to complete the end of the predicate (step 116).

Finally, for any predicate for which no dictionary match has been found, or a matching symbol was found in step 102, but it was not an exact match, the uncompressed symbol(s) are used to form a search criteria (step 118), which ends the process (100) for forming the search criteria. It should be noted that it is only necessary to search for the symbols obtained in steps 104, 106, 108, 109 and 118. After forming the search criteria, the search criteria are applied, which will now be described with reference to FIGS. 2-4.

Figure 2:
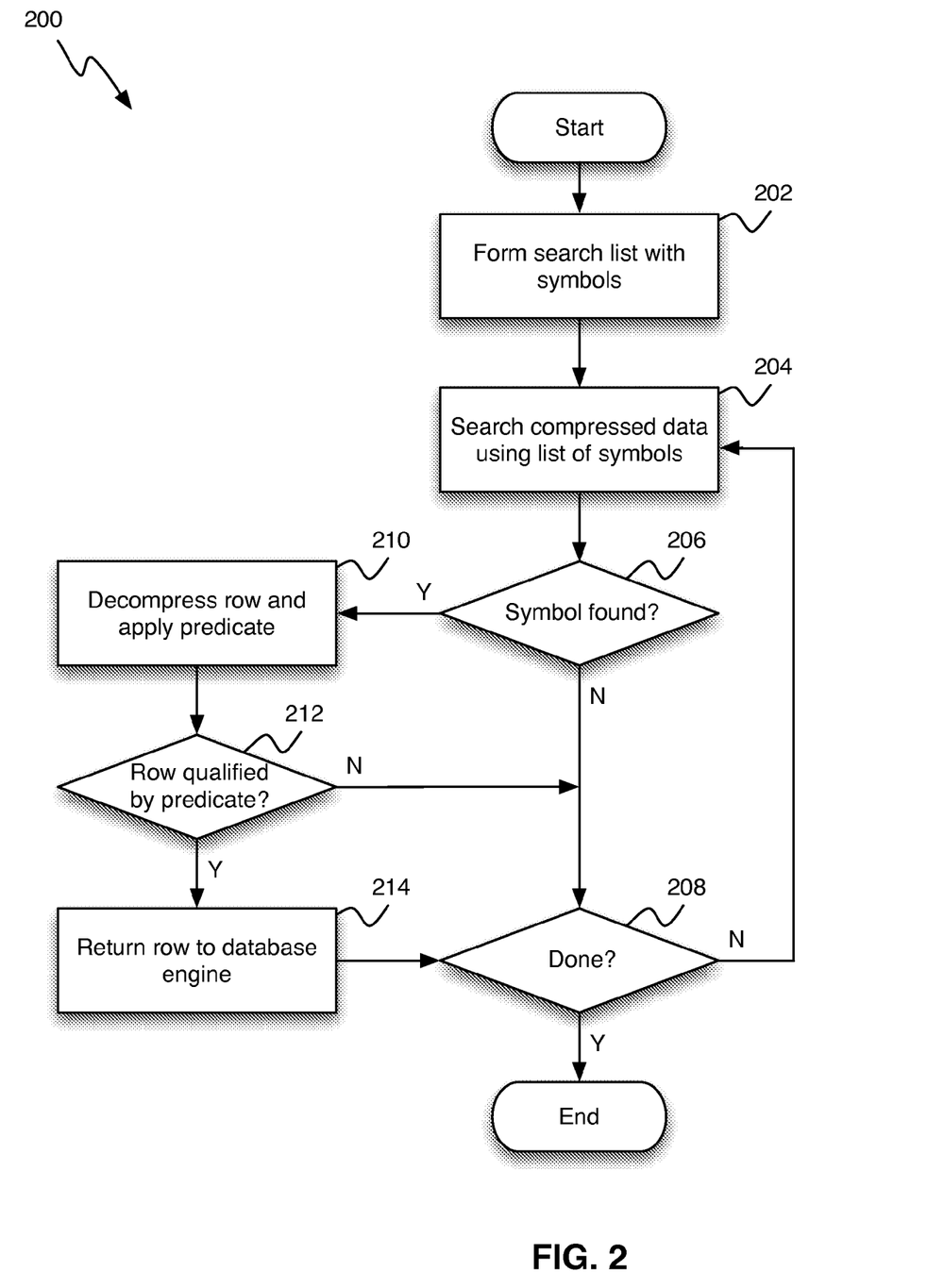
FIG. 2 shows a process (200) in accordance with one embodiment for a simplified method (200) for applying the search criteria.

FIG. 2 shows a process (200) in accordance with one embodiment for a simplified method (200) for applying the search criteria. The process (200) performs a search to identify potential rows. As can be seen in FIG. 2, the process starts by forming a search list that includes the symbols identified in steps 104, 106, 108, 109 and 118 of FIG. 1 (step 202).

Next, the compressed data is searched to find the symbols identified in the list of symbols (step 204). The process then determines whether a matching symbol has been found (step 206). If no matching symbol has been found, the process checks if there is more compressed data or more symbols to look for (step 208). If there is more compressed data or symbols, the process returns to step 204. If there is no more compressed data or symbols, the process ends.

If a matching symbol is found in step 206, the row is decompressed and the predicate is applied (step 210). Next, the process checks whether the decompressed row is qualified by the predicate (step 212). If the decompressed row is qualified by the predicate, then the row is either returned immediately to the database engine, or is buffered for returning to the database engine later, for further processing (step 214). The process then continues to step 208, and continues as described above with the searching resuming at the end of the row just processed, until all the compressed data and predicates have been examined, and qualifying rows have been returned to the database engine, or to the consuming application. If it is determined in step 212 that the row is not qualified by the predicate, the process continues to step 208 and proceeds as outlined above.

Figure 3:
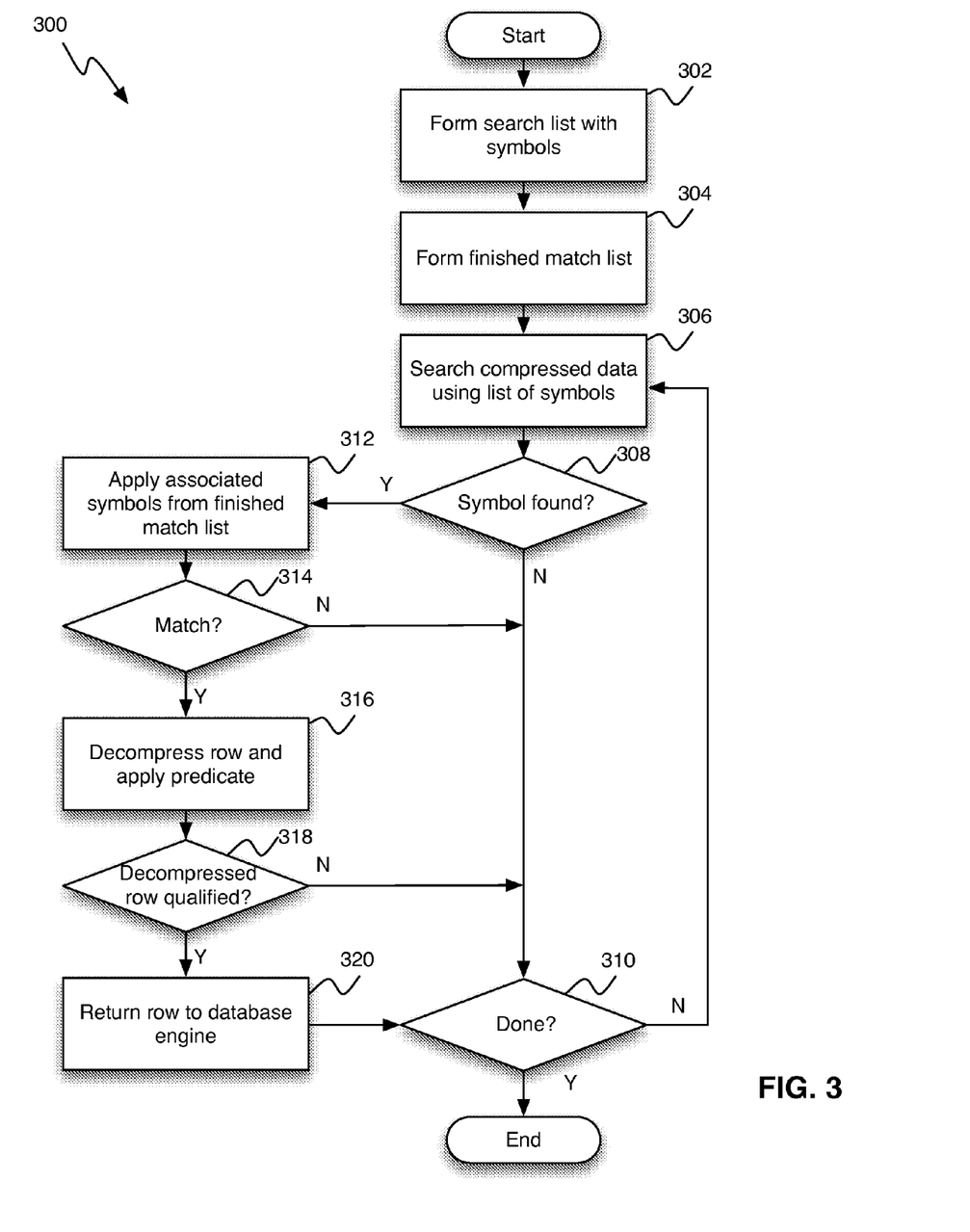
FIG. 3 shows a process (300) in accordance with one embodiment for a match method (300) for applying the search criteria.

FIG. 3 shows a process (300) in accordance with one embodiment for a match method (300) for applying the search criteria. The process (300) performs a search to fully match the predicate. As can be seen in FIG. 3, the process starts by forming a search list that includes the symbols identified in steps 104, 106, 108, 109 and 118 of FIG. 1 (step 302).

Next a finished match list is formed, (step 304) which includes the symbols identified in steps 110, 112, 114, and 116 of FIG. 1, and are associated with the corresponding search symbols in step 302.

Next, the compressed data is searched to find the symbols identified in the list of search symbols in step 302 (step 306). The process then checks whether a matching symbol has been found (step 308). If no matching symbol has been found, the process checks whether there is more compressed data or more symbols to look for (step 310). If there is more compressed data or symbols, the process returns to step 306. If there is no more compressed data or symbols, the process ends.

If a match to a symbol is found in step 308, then a predicate match is completed by applying the associated symbols from the finished match list in step 304 (step 312). If a match is found (step 314), then the row is decompressed and the predicate is applied (step 316). If the decompressed row is qualified by the predicate (step 318), then the row is either returned immediately to the database engine, or is buffered for returning to the database engine later, for further processing (step 320). Searching resumes at the end of the row just processed. The process then returns to step 310, and continues as described above, until all the compressed data and predicates have been examined, and qualifying rows have been returned to the database engine, or consuming application.

Figure 4:
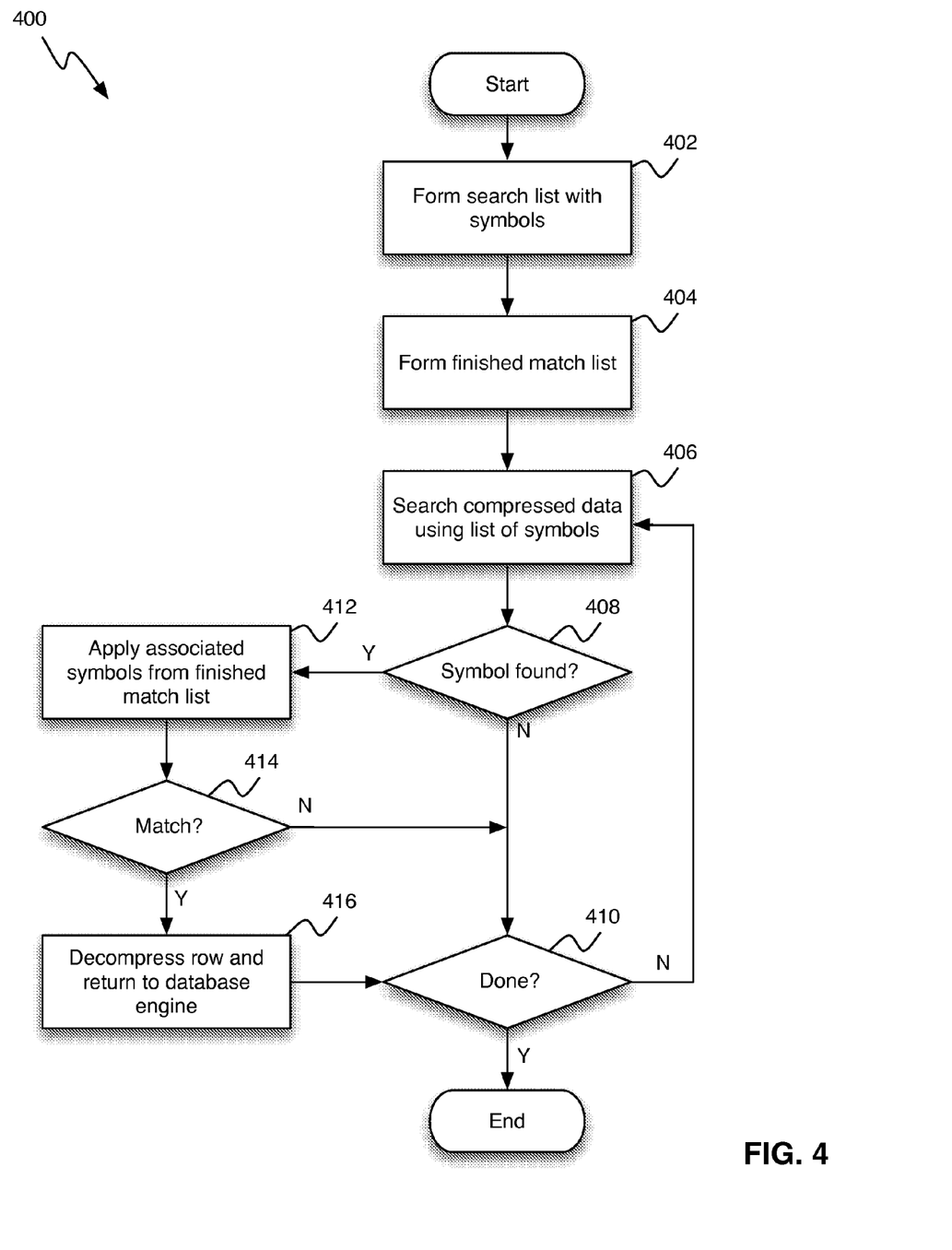
FIG. 4 shows a process (400) in accordance with one embodiment for a match method for applying the search criteria.

FIG. 4 shows a process (400) in accordance with one embodiment for a match method (400) for applying the search criteria. The process (400) performs a search to fully apply the predicate. As can be seen in FIG. 4, the process starts by forming a search list that includes the symbols identified in steps 104, 106, 108, 109 and 118 of FIG. 1 (step 402).

Next a finished match list is formed (step 404), which includes the symbols identified in steps 110, 112, 114 and 116 of FIG. 1, and are associated with the corresponding search symbols in step 402.

Next, the compressed data is searched to find the symbols identified in the list of symbols while also tracking the column positions, using the techniques described in Copending U.S. patent application Ser. No. 14/032,122 (step 406), thus qualifying with both symbol information and column position information to form an exact predicate match. The process then checks to see if a matching symbol has been found (step 408). If no matching symbol has been found, the process checks if there is more compressed data or more symbols to look for (step 410). If there is more compressed data or symbols, the process returns to step 406. If there is no more compressed data or symbols, the process ends.

If a match to a symbol is found in step 408, then a predicate match is completed by applying the associated symbols from the finished match list in step 404 (step 412). If a match is found (step 414), then the row is decompressed and is either returned immediately to the database engine, or is buffered for returning to the database engine later, for further processing (step 416). The process then returns to step 410, and continues as described above, until all the compressed data and predicates have been examined, and qualifying rows have been returned to the database engine, or consuming application.

Matching Algorithm—ANDed Predicate Search

Figure 5:
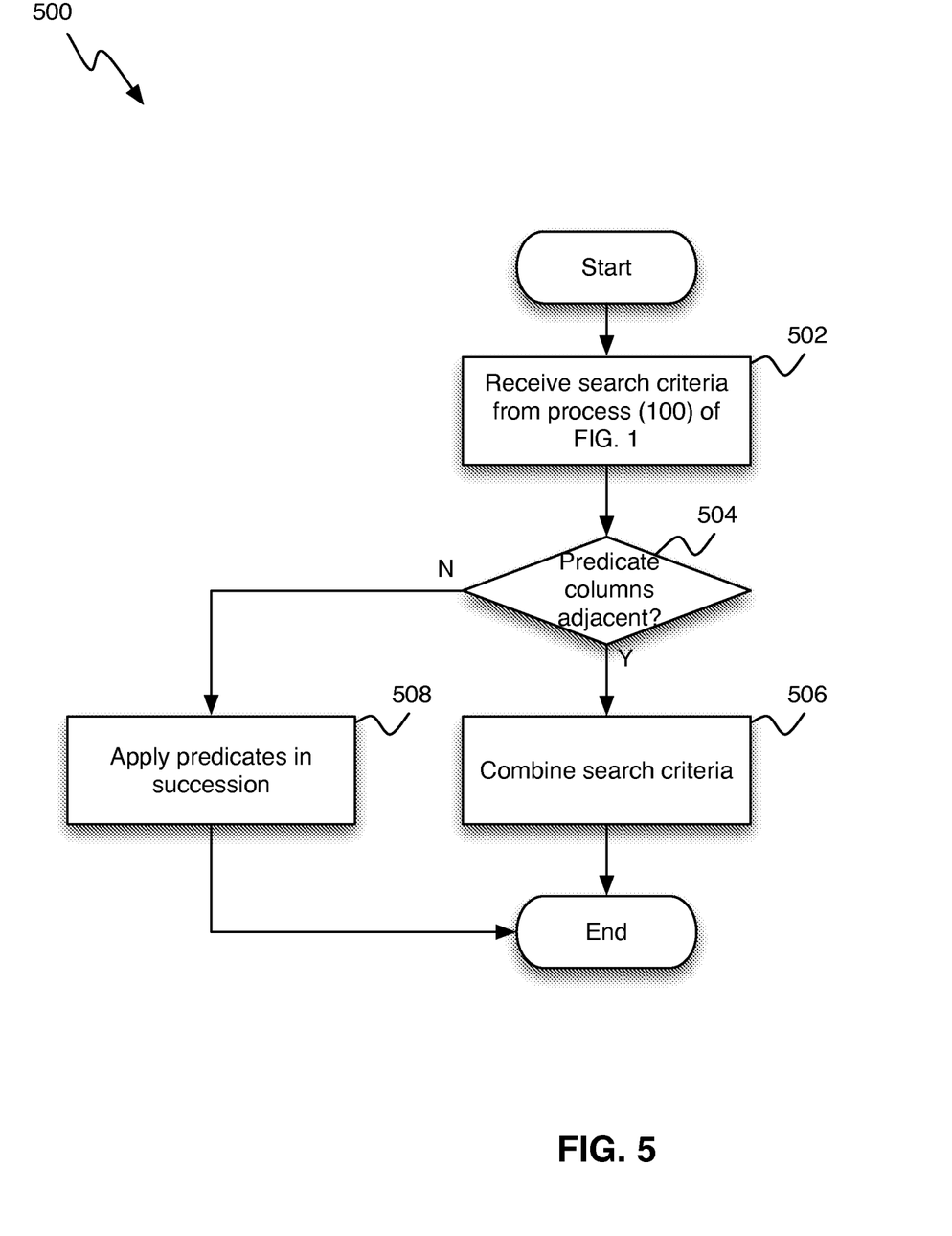
FIG. 5 shows a process (500) in accordance with one invention for forming the search criteria.

FIG. 5 shows a process (500) in accordance with one invention for forming the search criteria. As can be seen in FIG. 5, the process (500) starts by receiving search criteria for each predicate, using the process (100) described above with respect to FIG. 1 (step 502). Next it is examined whether the predicate columns are adjacent (step 504). If the predicate columns are adjacent, then the search criteria are combined (step 506). When combining the search criteria, the leading column uses symbols from steps 104, 106, 108, 109 and 118 of FIG. 1, and the trailing column(s) uses symbols from steps 104, 108, 109 and 118 of FIG. 1.

If it is determined in step 504 that the predicate columns are not adjacent, then each predicate is applied in succession. In some embodiments, instead of applying each predicate in succession, a larger search pattern can be computed. In computing such a larger search pattern, the compressed data is searched looking for the compression symbols identified in step 202 of FIG. 2. When a row is found, the search criteria are applied for each subsequent column until all predicates have been applied. Then, similar to what is done in steps 206 and 210 of the process of FIG. 2, when a matching symbol is found for all predicates, the row is decompressed and the predicates are applied. This ends the process (500). Similarly, a practitioner skilled in the art, will recognize that the techniques of processes 300 and 400 can be similarly applied to the larger search patterns formed in process 500.

Matching Algorithm—ORed Predicate Search

In the case with ORed predicate search, the search criteria is first formed for each predicate, using the process 100 of FIG. 1. The combined list of search criteria for the different predicates forms the complete list of symbols to be searched for. Next, the processes 200, 300, or 400 of FIGS. 2, 3 and 4, respectively, are applied to identify the qualifying rows.

It should be noted that the above techniques can be used to apply "pattern" based predicates, such as LIKE, by forming the search criteria as described in the process 100 of FIG. 1 for the know parts of the pattern, and then searching the compressed data as described in processes 200, 300 and 400 to qualify matching rows.

Concluding Comments

It should be noted that the techniques described above can be further leveraged to be applied to multi-level compression, by searching for a series of compressed symbols in a next level-up decompression string dictionary. For example, in a given system there may be so-called row compression, in which commonly occurring portions of a row are represented as symbols in a table level compression dictionary, with a symbol used to represent that portion of the row. Then there may also be so-called page compression, in which each page contains a compression dictionary of the most commonly occurring byte strings for that page. Those byte strings are then replaced by a second set of symbols that are specific to that page.

In this second, page compression scheme, the methods of the related application can be applied again based on the sets of compression symbols formed in process 100 to form a new set of compression symbols of interest. This new, derived set of compression symbols can then be applied in search processes 200, 300 and 400. As the skilled person realizes, this concept can be repeated for further levels of compressions, etc., if such additional compression levels exist.

Similarly, a practitioner skilled in the art, will recognize that the techniques described herein can also be applied to embedded, or progressively built dictionaries, such as those techniques used by the Lempel-Ziv-Welch (LZW) family of compression algorithms, and the various derivatives thereof. In that case, as new compression symbols are formed, the steps in process 100 would be repeated to form, add, or update the sets of compression symbols of interest. The new set of symbols can then be applied in search processes 200, 300 and 400, as they continue at steps 208, 310 and 410 respectively. As the skilled person realizes, optimizations can be applied to the steps of process 100 through the examination of the newly formed dictionary symbol and the search criteria symbols, to replace, or add new search criteria symbols.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A computer program product for predicate application using partial compression dictionary match, the computer program product comprising a computer readable storage medium having program instructions embodied therewith, wherein the computer readable storage medium is not a transitory signal per se, the program instructions being executable by a processor to cause the processor to perform a method comprising:
  developing a search strategy for each predicate to be applied to compressed data, the search strategy comprising:
    searching entries of a compression dictionary for an entire predicate value to identify each matching symbol and noting an exact match, and a subsumed match of a compression symbol in a search list;
    searching the entries of the compression dictionary to identify entries in which a predicate prefix forms a dictionary entry suffix and noting each matching compression symbol in the search list;
    searching the entries of the compression dictionary to identify entries in which a predicate suffix forms a dictionary entry prefix and noting each matching compression symbol in the search list;
    searching the entries of the compression dictionary to identify entries which form a mid-predicate match and noting each matching compression symbol in the search list; and
    adding one or more uncompressed symbols for predicates having no match in the compression dictionary, and for predicates having only one or more subsumed dictionary matches;
  searching the compressed data to locate the compression symbols identified in the search list; and
  in response to locating a compression symbol from the search list in the compressed data, decompressing a respective row and applying the predicate, and
  returning a respective row that matches the predicate to one of: a database engine and an application.

2. The computer program product of claim 1, wherein searching the compressed data to locate the compression symbols identified in the search list further comprises:
  tracking column positions and offset of the search list within the column; and
  matching the compression symbol lists and associated column positions.

3. The computer program product of claim 1, wherein the method further comprises identifying a full match of each predicate by:
  forming an initial search list including the compression symbols identified in the search strategy;
  forming a finished match list, the finished match list including:
    a predicate suffix for each predicate prefix that matches a dictionary entry suffix, wherein the predicate suffix includes one or more of: uncompressed symbols and compressed mid-predicate match symbols,
    a predicate prefix for each predicate suffix that matches a dictionary entry prefix, wherein the predicate prefix includes one or more of: uncompressed symbols and compressed mid-predicate match symbols, a mid-predicate match for each predicate prefix and predicate suffix that matches one of: a dictionary entry prefix and a dictionary entry suffix and do not overlap in their matching of the predicate, wherein the mid-predicate match includes one or more of: uncompressed symbols and compressed mid-predicate match symbols, and a predicate prefix and a predicate suffix for each dictionary entry that forms a mid-predicate match, wherein the predicate prefix and predicate suffix includes one or more of: uncompressed symbols and compressed mid-predicate match symbols;

searching the compressed data for lead compression symbols identified in the initial search list;

in response to locating a lead compression symbol from the initial search list in the compressed data, completing a predicate match by applying the associated symbols to the compression symbols identified in the finished match list; and decompressing a respective row and fully applying the predicate using the initial search list, the finished match list and the lead compression symbols identified in the initial search list.

4. The computer program product of claim 3, wherein fully applying the predicate further comprises:

including in the initial search list a column position associated with each symbol;

tracking column positions during the compressed data scan;

matching the compression symbol lists and associated column positions; and qualifying with column position information, to form an exact predicate match, to fully qualify the row.

5. The computer program product of claim 1, wherein the method further comprises:

receiving a predicate to be applied to the compressed data.

6. The computer program product of claim 3, wherein an associated symbol is one of: a predicate suffix completing a dictionary entry suffix, a predicate prefix completing a dictionary suffix, a prefix completing a mid-predicate match and a suffix completing a mid-predicate match.

7. The computer program product of claim 1, wherein the compressed data is multi-level compressed data.

8. The computer program product of claim 1, wherein the dictionary is one of: an embedded dictionary and a progressively built dictionary.

9. The computer program product of claim 8, wherein the method further comprises:

updating the initial search list is as the progressively built dictionary evolves.

10. A system for predicate application using partial compression dictionary match, the system comprising:

a processor; and a memory containing instructions executable by the processor to perform the following operations:

developing a search strategy for each predicate to be applied to compressed data, the search strategy comprising:

searching entries of a compression dictionary for an entire predicate value to identify each matching symbol and noting an exact match, and a subsumed match of a compression symbol in a search list;

searching the entries of the compression dictionary to identify entries in which a predicate prefix forms a dictionary entry suffix and noting each matching compression symbol in the search list;

searching the entries of the compression dictionary to identify entries in which a predicate suffix forms a dictionary entry prefix and noting each matching compression symbol in the search list;

searching the entries of the compression dictionary to identify entries which form a mid-predicate match and noting each matching compression symbol in the search list; and adding one or more uncompressed symbol for predicates having no match in the compression dictionary, and for predicates having only one or more subsumed dictionary matches;

searching the compressed data to locate the compression symbols identified in the search list; and in response to locating a compression symbol from the search list in the compressed data, decompressing a respective row and applying the predicate, and returning a respective row that matches the predicate to one of: a database engine and an application.

* * * * *